(12) United States Patent
Yoneda

(10) Patent No.: US 6,353,625 B1
(45) Date of Patent: Mar. 5, 2002

(54) ARRAY TYPE LASER DIODE

(75) Inventor: Isao Yoneda, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/246,731

(22) Filed: Feb. 9, 1999

(30) Foreign Application Priority Data

Feb. 16, 1998 (JP) .......................................... 10-033410

(51) Int. Cl.$^7$ ................................................ H01S 5/026
(52) U.S. Cl. ........................................ 372/50; 372/36
(58) Field of Search ..................................... 372/36, 50

(56) References Cited

U.S. PATENT DOCUMENTS

| | | | |
|---|---|---|---|
| 5,305,342 A | 4/1994 | Ota ............................. | 372/50 |
| 5,790,578 A | * 8/1998 | Takano ........................ | 372/50 |
| 5,848,084 A | * 12/1998 | Rokugawa .................... | 372/50 |
| 5,852,624 A | * 12/1998 | Matsuyama et al. .......... | 372/46 |

FOREIGN PATENT DOCUMENTS

| | | |
|---|---|---|
| JP | 58124972 | 8/1983 |
| JP | 63-276287 | 11/1988 |
| JP | 64-61085 | 3/1989 |
| JP | 2-103987 | 4/1990 |
| JP | 3-206678 | 9/1991 |
| JP | 5-55712 | 3/1993 |
| JP | 5-67840 | 3/1993 |
| JP | 7-283480 | 10/1995 |
| JP | 7-335969 | 12/1995 |
| JP | 9-129970 | 5/1997 |

OTHER PUBLICATIONS

Japanese Office Action dated Nov. 21, 2000, with partial English translation.
Japanese Office Action dated Aug. 31, 1999, with partial translation.
European Search Report dated May 26, 1999.

* cited by examiner

*Primary Examiner*—James W. Davie
(74) *Attorney, Agent, or Firm*—McGinn & Gibb, PLLC

(57) ABSTRACT

An array type laser diode includes an active layer, a cathode electrode, and bonding electrodes. The active layer is formed in a substrate into a stripe shape to serve as an emission portion. The cathode electrode is formed on a mounting surface of the substrate into a stripe shape to be close to the active layer. The bonding electrodes are formed on the mounting surface of the substrate to be physically separated from the drive electrode.

20 Claims, 3 Drawing Sheets

ARRAY TYPE LASER DIODE

BACKGROUND OF THE INVENTION

The present invention relates to an array type laser diode and, more particularly, to an array type laser diode in which a thermal stress generated when the diode is mounted on a substrate with a solder is reduced and its heat dissipation is improved.

A laser diode used in arrayed light-transmitting/receiving module applied to optical interconnection is an array type element in which a plurality of channels are integrated. This laser diode is used by fixing it on a silicon substrate by passive alignment mounting. The array type laser diode mounted on the silicon substrate is optically coupled to an optical fiber or optical waveguide.

Mainly two types of laser diodes are available, i.e., one using a p-type substrate and one using an n-type substrate. An active layer is buried close to the mounting surface. Striped electrodes are formed on the mounting surface to be parallel to the active layer. Usually, the laser diode is mounted on the silicon substrate through the mounting surface such that the active layer is located at the lower side.

Conventionally, when a p-type substrate array type laser diode 100 having this arrangement is to be mounted on a silicon substrate, only striped cathode electrodes 104 formed on the mounting surface immediately under the active layer are bonded to the silicon substrate with a solder, as shown in FIG. 6.

The mounting process will be described. Cathode electrodes and electrode pads are formed on the array type laser diode and the silicon substrate, respectively, such that striped cathode electrodes and the electrode pads formed on the silicon substrate surface coincide with each other when the laser diode is mounted on the silicon substrate. For bonding, solder layers are formed on the electrode pads of the silicon substrate in advance.

After that, the array type laser diode is positioned at a predetermined position on the silicon substrate at room temperature, and the entire silicon substrate is heated to fuse the solder layers, thereby bonding the electrode pads and cathode electrodes to each other. The structure is cooled to room temperature to solidify the fused solder. The electrode pads of the silicon substrate and the cathode electrodes are bonded to each other through the solder, thereby fixing the array type laser diode to the silicon substrate.

When the temperature decreases from the solder fusing temperature to room temperature, a thermal stress is generated on the solder bonding surface. This thermal stress concentrates on a region near the solder bonding surface. Hence, the thermal stress generated in the cathode electrodes is transmitted to the active layer arranged close to the cathode electrodes, to degrade the characteristics or reliability of the active layer.

The thermal stress acting on the active layer increases in accordance with an increase in the number of channels. Accordingly, the number of channels of the array type laser diode is limited to about 4. When a 12-channel module, which is the mainstream nowadays, is to be formed, a plurality of array type laser diodes are required. The mounting process accordingly includes a plurality of steps to increase the cost.

Heat generated when the laser diode is driven is transmitted to the substrate through the cathode electrodes on the bonding surface and the electrode pads on the substrate. Since the bonding surface is small, heat is not transmitted easily to provide poor heat dissipation. In order to decrease the thermal stress acting on the active layer and to improve heat dissipation, the bonding area between the laser diode and silicon substrate must be increased.

In order to operate the laser diode at a high speed of about several GHz, the bonding area must be decreased to reduce the junction capacitance. In this manner, from the plurality of viewpoints described above, contradictory requirements are imposed on the area of the bonding electrodes. Such requirements are conventionally difficult to satisfy simultaneously.

SUMMARY OF THE INVENTION

It is an object of the present invention to provide an array type laser diode in which a thermal stress acting on the active layer when bonding the laser diode to the substrate can be reduced and its heat dissipation in use is improved.

It is another object of the present invention to provide an array type laser diode which can operate at a high speed.

In order to achieve the above objects, according to the present invention, there is provided an array type laser diode comprising an active layer formed in a first substrate into a stripe shape to serve as an emission portion, a drive electrode formed on a mounting surface of the first substrate into a stripe shape to be close to the active layer, and bonding electrodes formed on the mounting surface of the first substrate to be physically separated from the drive electrode.

DESCRIPTION OF THE PREFERRED EMBODIMENTS

The present invention will be described in detail with reference to the accompanying drawings.

Figure 1:
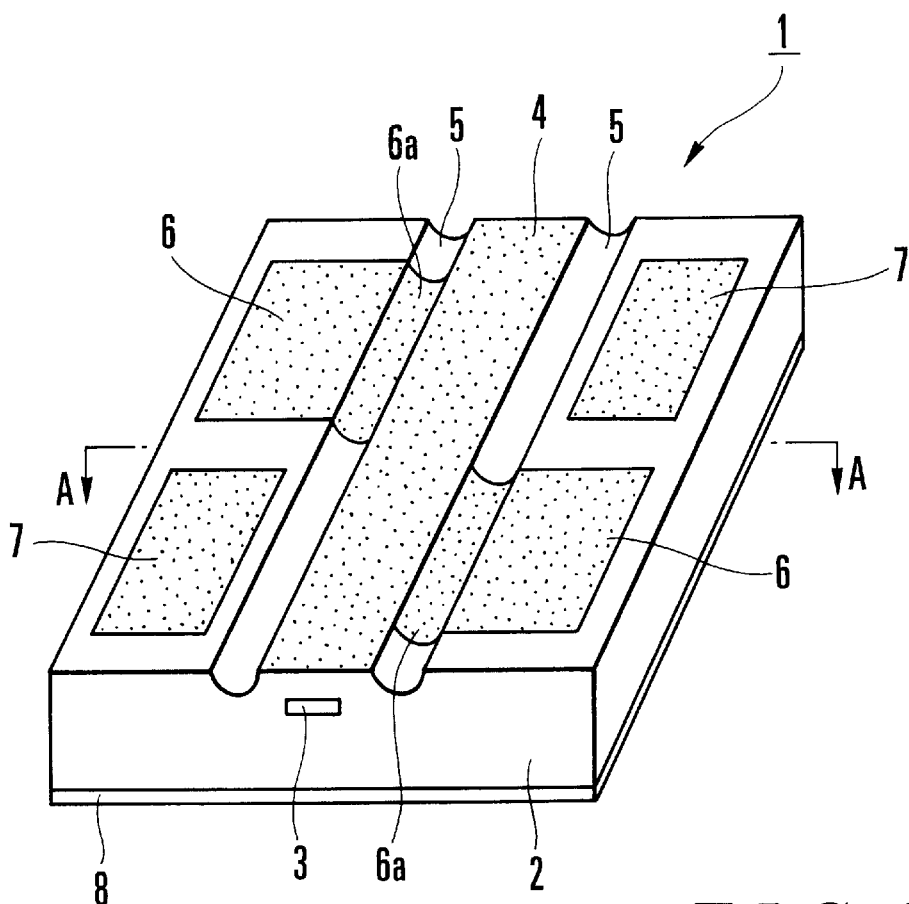
FIG. 1 is a perspective view of an array type laser diode corresponding to 1 channel according to an embodiment of the present invention.

FIG. 1 shows an array type laser diode according to an embodiment of the present invention, which corresponds to 1 channel.

Figure 2:
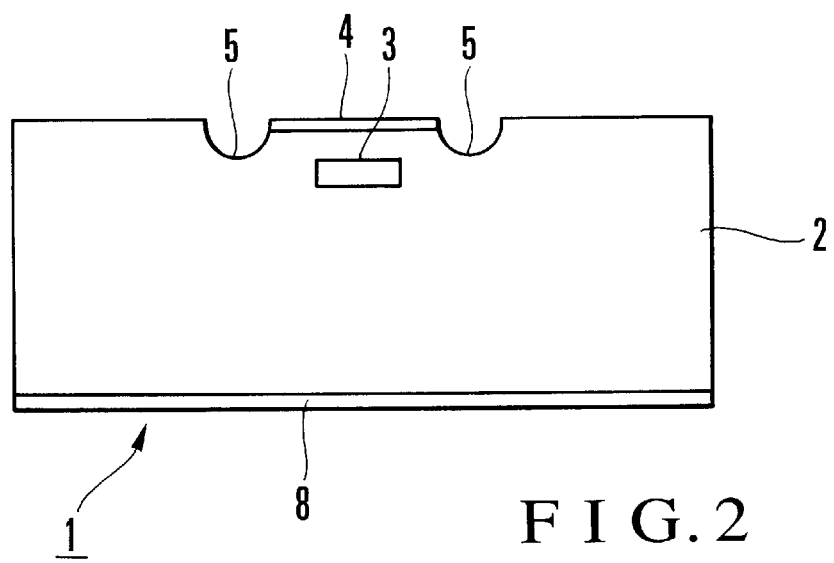
FIG. 2 is a sectional view taken along the line A—A of FIG. 1.

Referring to FIG. 1, an array type laser diode 1 is a mesa type laser formed on a p-type substrate 2. A striped p-or n-type active layer 3 serving as an emission portion is buried in the p-type substrate 2 at a depth of about 5 μm from its surface. A striped cathode electrode 4 for supplying a current to the active layer 3 is formed on the mounting surface of the p-type substrate 2 to be close and parallel to the active layer 3. A pair of grooves 5 extending in the longitudinal direction are formed on the two sides of the cathode electrode 4. As shown in FIG. 2, the cathode electrode 4 is formed on a projecting surface portion having a trapezoidal section (mesa) sandwiched by the grooves 5. This reduces the junction capacitance of the cathode electrode 4.

A pair of branched bonding electrodes 6 and a pair of island bonding electrodes 7, which are the characteristic features of the present invention, are point-symmetrically formed at regions of the mounting surface on the two sides sandwiching the mesa region constituted by the cathode electrode 4 and the grooves 5 on the two sides of the cathode electrode 4. The branched bonding electrodes 6 are electrically connected to the cathode electrode 4 through connecting portions 6a in the grooves 5. The island bonding electrodes 7 are insulated from the surrounding portion and are thus electrically independent.

The branched bonding electrodes 6 and island bonding electrodes 7 are electrodes that are bonded, through a solder, to the pad electrodes of a silicon substrate (not shown) on which the array type laser diode 1 is mounted. In order to increase the bonding area as large as possible, the branched bonding electrodes 6 and island bonding electrodes 7 have rectangular shapes and are symmetrically arranged on the mounting surface regions on the two sides of the active layer 3 as the central line.

An anode electrode 8 commonly used by the respective channels is formed on the entire surface of the p-type substrate 2 on a side opposite to the mounting surface where the cathode electrode 4 are formed. In order to accurately mount the array type laser diode 1 at a predetermined position on the silicon substrate, a circular metal film marker (not shown) for alignment is formed on the mounting surface of the p-type substrate 2.

In the array type laser diode 1, the island bonding electrodes 7 are electrically isolated from the cathode electrode 4, and the branched bonding electrodes 6 are also separated from the mesa region and distant from the active layer 3. Accordingly, the effective area of the cathode electrode 4 is not substantially increased. As a result, an increase in junction capacitance is minimum and the array type laser diode 1 can accordingly operate at a high speed.

Figure 3:
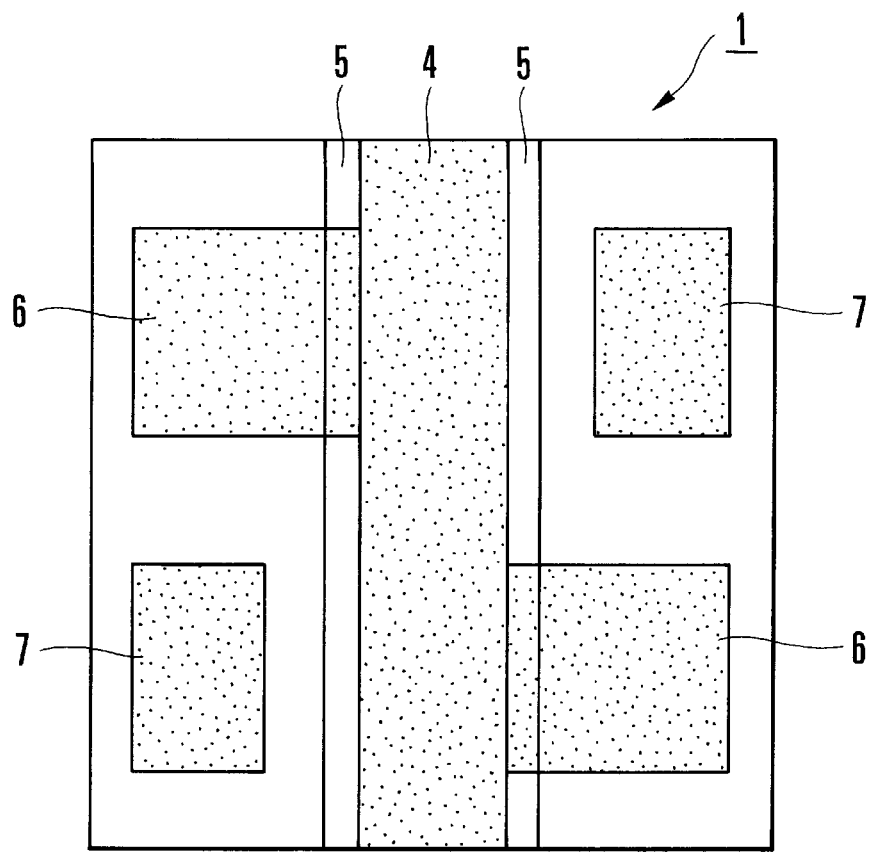
FIG. 3 is a plan view of the array type laser diode shown in FIG. 1.

FIG. 3 shows the array type laser diode 1 corresponding to 1 channel shown in FIG. 1. In FIG. 3, an area equal to or larger than half the mounting surface is occupied by the bonding surfaces of the cathode electrode 4, branched bonding electrodes 6, and island bonding electrodes 7, forming a large bonding surface.

Figure 4:
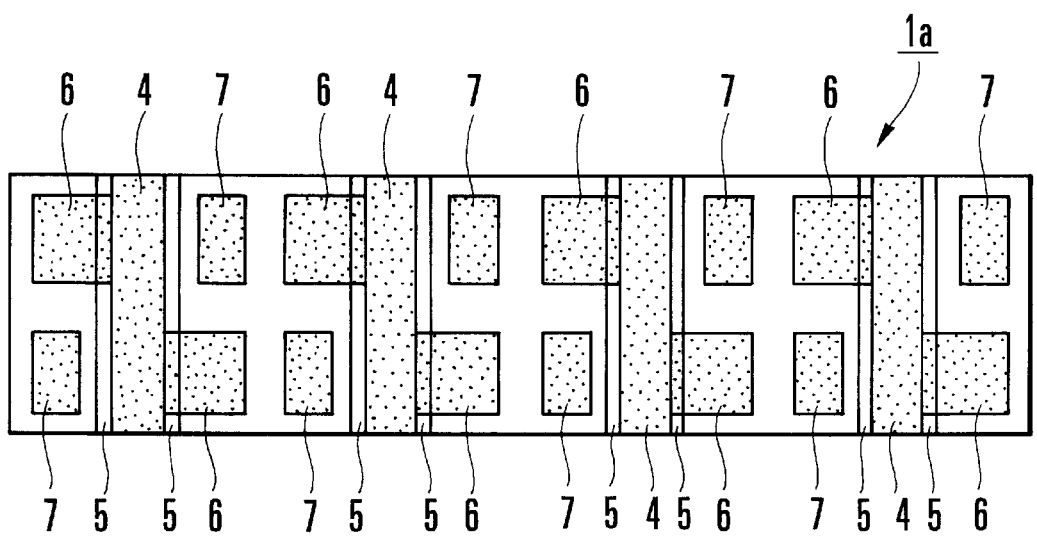
FIG. 4 is a plan view of an array type laser diode corresponding to 4 channels according to another embodiment of the present invention.

FIG. 4 shows an array type laser diode 1a corresponding to 4 channels according to another embodiment of the present invention.

Referring to FIG. 4, the four channels each having the electrode layout shown in FIG. 3 are continuously formed on a single p-type substrate 2 (FIG. 1) in the widthwise direction of cathode electrodes 4. Branched bonding electrodes 6 and island bonding electrodes 7 that are adjacent to each other and constitute 2 channels are arranged to be separated from each other by predetermined distances. The cathode electrodes 4 are independent in units of channels, and an anode electrode 8 (FIG. 1) is commonly used by the 4 channels.

Although FIG. 4 shows an array type laser diode corresponding to 4 channels, the array type laser diode according to the present invention may have 1 channel or 12 channels. The number of channels is not limited.

A silicon substrate (not shown) on which the array type laser diode 1 or 1a is to be mounted has, e.g., a thickness of 625 µm. A silicon oxide film having a thickness of 0.5 µm is formed on each of the two surfaces of the silicon substrate. Electrode pads are formed on each silicon oxide film formed on the silicon substrate to have the same pattern as that of the cathode electrodes of the array type laser diode 1 shown in FIG. 3 or 4. The electrode pads formed on the silicon substrate are formed of multilayered metal films each constituted by titanium, platinum, and gold films in this order from the substrate side. Also, an alignment marker made of an annular metal film is also formed.

An optical fiber of optical waveguide to be optically coupled to the array type laser diode 1 or 1a, which is to be mounted, is mounted on this silicon substrate. AuSn solder layers are formed on the electrode pads of the silicon substrate by punching, vapor deposition, plating, or the like.

In the process of mounting the array type laser diode 1 or 1a on the silicon substrate having the above arrangement, first, the array type laser diode 1 or 1a is placed at a predetermined position on the silicon substrate. The markers formed on the array type laser diode 1a or 1 and the silicon substrate are aligned with each other at room temperature by using an infrared ray which can be transmitted through the silicon substrate and the array type laser diode 1 or 1a, thereby performing positioning at high precision. When alignment is achieved, the entire silicon substrate is heated to the solder fusing temperature to bond the cathode electrode 4, branched bonding electrodes 6, and island bonding electrodes 7 to the electrode pads of the silicon substrates. After bonding, the structure is cooled to room temperature to solidify the solder. As a result, the array type laser diode 1 or 1a is fixed to the silicon substrate, and the mounting operation is complete.

Figure 5:
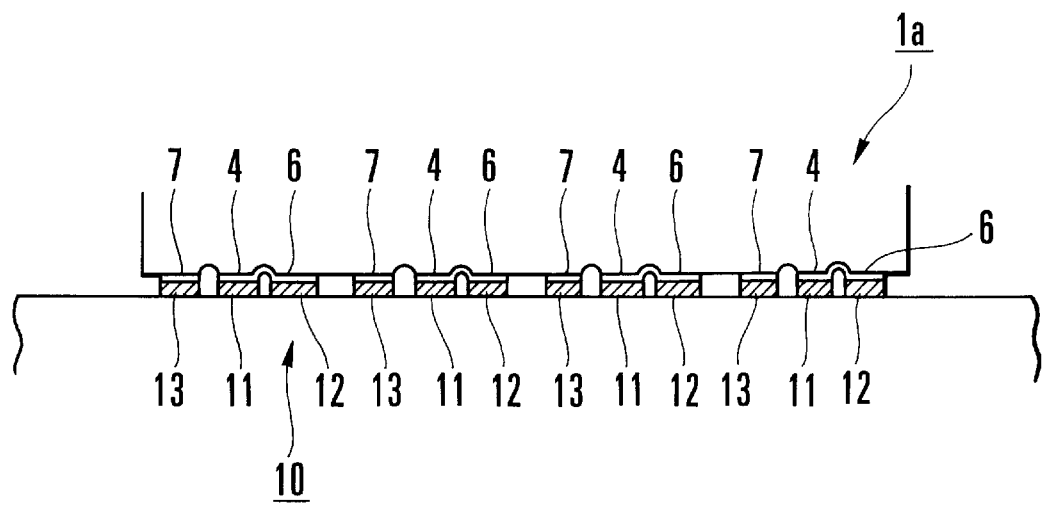
FIG. 5 is a sectional view showing a state wherein the array type laser diode shown in FIG. 4 is mounted on a silicon substrate.

FIG. 5 shows a state wherein the array type laser diode 1a shown in FIG. 4 is mounted on a silicon substrate 10.

The striped cathode electrodes 4 of the array type laser diode 1a are bonded to striped pad electrodes 11, having the same shapes as those of the cathode electrodes 4, of the silicon substrate. The branched bonding electrodes 6 of the array type laser diode 1a are bonded to pad electrodes 12, having the same shapes as those of the branched bonding electrodes 6, of the silicon substrate. The island bonding electrodes 7 of the array type laser diode 1a are bonded to pad electrodes 13, having the same shapes as those of the island bonding electrodes 7, of the silicon substrate. Through these electrode bonding surfaces, the array type laser diode 1 is mounted on and fixed to the silicon substrate 10.

In this mounting structure, heat generated when the array type laser diode 1a is driven is conducted to the silicon substrate 10 from these electrode bonding surfaces.

When the array type laser diode 1a is to be mounted to the silicon substrate 10, after the silicon substrate 10 is heated to fuse the solder to achieve bonding, the resultant structure is cooled to the room temperature. During this process, a thermal stress is generated near the solder bonding portions.

Figure 6:
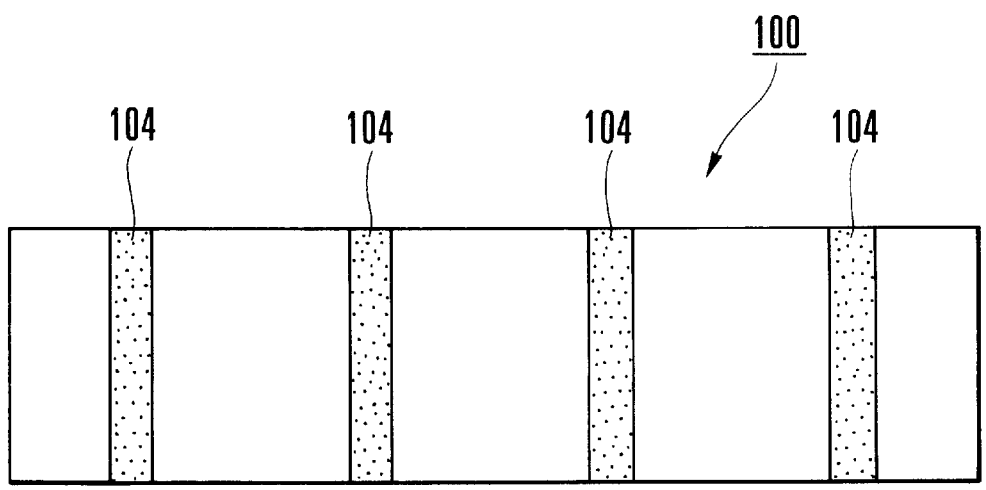
FIG. 6 is a plan view of a conventional array type laser diode.

Conventionally, as shown in FIG. 6, since only the striped cathode electrodes 104 of the laser diode 100 serve as the bonding surfaces, the thermal stress concentrates around the cathode electrodes 104, to concentratedly act on the active layer close to the cathode electrodes 104.

In contrast to this, in the array type laser diode 1a of this embodiment, as shown in FIG. 4, since the area of electrodes to be bonded with the solder is large and the bonding area occupies a large proportion of the mounting surface, the thermal stress is generated uniformly almost in the entire portion of the mounting surface. Therefore, the thermal stress does not concentrate on the active layer 3, and a degradation in characteristics or reliability of the active layer 3 is decreased.

Since the thermal stress acting on the active layer 3 increases in accordance with an increase in the number of channels of the array type laser diode 1a, the number of channels is conventionally limited to about 4. In contrast to this, in the array type laser diode 1a of this embodiment, the thermal stress acting on the active layer 3 can be moderated, so that the number of channels of one element can be increased. As a result, when mounting a multi-channel diode, the number of mounting steps can be decreased to decrease the cost.

In the array type laser diode, heat generated when the laser diode is driven is transmitted from the array type laser diode to the silicon substrate through the electrode bonding surfaces, and is dissipated. Therefore, the silicon substrate has the function of heat dissipater as well. Conventionally, as shown in FIG. 6, since heat is transmitted through the striped cathode electrodes 104, heat dissipation is poor and a high output cannot be achieved.

In contrast to this, in the array type laser diode 1 of the present invention, since heat is transmitted to the silicon substrate 10 through the branched bonding electrodes 6 and island bonding electrodes 7 in addition to the cathode electrode 4, the heat transmission area is large, and good heat dissipation can be achieved.

In the above embodiments, the laser diode is bonded to the silicon substrate through all of the cathode electrode 4, branched bonding electrodes 6, and island bonding electrodes 7. It suffices if the cathode electrode 4 has the function of supplying a current to the active layer. Accordingly, the cathode electrode 4 need not be bonded, but only the branched bonding electrodes 6 and island bonding electrodes 7 may be bonded to the silicon substrate.

The position and shape of the branched bonding electrodes 6 and island bonding electrodes 7 are not limited in attaining the purpose of increasing the bonding area and heat conduction area. For example, the branched bonding electrodes 6 and island bonding electrodes 7 may have circular shapes, elliptic shapes, or combinations of different rectangles elongated in different directions. Also, the branched bonding electrodes 6 and island bonding electrodes 7 need not be point- or axi-symmetrical.

In the above embodiments, the array type laser diode 1 or 1a is of a mesa type having a p-type substrate. However, the laser diode may have an n-type substrate, or be any laser diode other than the mesa type, as a matter of course.

As has been described above, according to the array type laser diode of the present invention, the bonding area with the substrate becomes larger than that in the conventional case by an amount corresponding to the area of the branched bonding electrodes, and relaxation of the thermal stress and improvement of heat dissipation accordingly become possible. In addition, the junction capacitance with respect to the active layer is not substantially increased since the branched bonding electrodes are distant from the striped electrodes, thus enabling a high-speed operation.

The bonding area with the substrate becomes larger than that in the conventional case by an amount corresponding to the area of the island bonding electrodes, and relaxation of the thermal stress and improvement of heat dissipation accordingly become possible. In addition, since the island bonding electrodes area are electrically isolated from the striped electrodes, the junction capacitance is not increased, thus enabling a high-speed operation.

Since both the branched bonding electrodes and island bonding electrodes are provided, the bonding area is further increased while the junction capacitance is increased only slightly, so that relaxation of the thermal stress, improvement of heat dissipation, and a high-speed operation become possible.

Since the laser diode is of the mesa type and its structure has a small junction capacitance, the bonding area can be increased while a high-speed operation is maintained.

Since the bonding area is increased, the thermal stress generated upon bonding with the solder is moderated to provide a multi-channel structure.

In a mesa type laser diode which can perform a high-speed operation and has a small junction capacitance, the bonding area can be increased without increasing the junction capacitance.

What is claimed is:

1. An array type laser diode comprising:
   an active layer formed in a first substrate into a stripe shape to serve as an emission portion;
   a drive electrode formed on a mounting surface of said first substrate into a stripe shape to be close to said active layer; and
   a branched bonding electrode and an island bonding electrode formed on said mounting surface of said first substrate.

2. A diode according to claim 1, wherein said bonding electrodes comprise branched bonding electrodes electrically connected to said drive electrode.

3. A diode according to claim 1, wherein
   said diode further comprises a pair of grooves formed on two sides of said drive electrode to extend in a longitudinal direction, and
   said drive electrode is formed on a mesa-shaped projecting surface portion sandwiched by said grooves.

4. A diode according to claim 3, wherein
   said bonding electrodes comprise branched bonding electrodes electrically connected to said drive electrode, and
   said branched bonding electrodes are electrically connected to said drive electrode in said grooves.

5. A diode according to claim 1, wherein said bonding electrodes are arranged on two sides of said drive electrode point-symmetrically.

6. A diode according to claim 1, wherein
   said diode further comprises an anode electrode formed on an entire surface, opposite to said mounting surface, of said first substrate, and
   said drive electrode constitutes a cathode electrode.

7. A diode according to claim 1, wherein
   said first substrate is mounted on a second substrate through said mounting surface, and
   said bonding electrodes are bonded to pad electrodes, having the same shapes as those of said bonding electrodes, of said second substrate.

8. A diode according to claim 1, wherein a plurality of channels each constituted by a combination of said drive electrode, said active layer, and said bonding electrodes are aligned on said first substrate in a widthwise direction of said drive electrode.

9. A diode according to claim 1, wherein said bonding electrodes are arranged on two sides of said drive electrode point-symmetrically and asymmetrically about a center line.

10. A diode according to claim 1, wherein said bonding electrodes are rectangular.

11. A diode according to claim 1, wherein said bonding electrodes are arranged on two sides of said drive electrode point-symmetrically.

12. A diode according to claim 10, wherein said bonding electrodes are arranged on two sides of said drive electrode point-symmetrically.

13. A diode according to claim 9, wherein said bonding electrode is formed on an entire surface, opposite to said mounting surface, of said first substrate, and said drive electrode comprises a cathode electrode.

14. A diode according to claim 10, wherein said bonding electrode is formed on an entire surface, opposite to said mounting surface, of said first substrate, and said drive electrode comprises a cathode electrode.

15. A diode according to claim 1, wherein said bonding electrodes are electrically connected to said drive electrode through connecting portions in a groove, said groove running along an edge of the drive electrode.

16. A diode according to claim 1, wherein said drive electrode is formed on the mounting surface to be close and parallel to said active layer, and wherein said bonding electrodes are formed on said mounting service to be distant from said active layer.

17. An array type laser diode comprising:

an active layer formed in a first substrate into a stripe shape to serve as an emission portion;

a drive electrode formed on a mounting surface of said first substrate into a stripe shape to be close to said active layer; and a branched bonding electrode and an island bonding electrode formed on said mounting surface of said first substrate, wherein said island bonding electrode comprises island bonding electrodes electrically isolated from said drive electrode.

18. An array type laser diode comprising:

an active layer formed in a first substrate into a stripe shape to serve as an emission portion;

a drive electrode formed on a mounting surface of said first substrate into a stripe shape to be close to said active layer; and bonding electrodes formed on said mounting surface of said first substrate to be physically separated from said drive electrode, wherein said bonding electrodes comprise branched bonding electrodes electrically connected to said drive electrode and island bonding electrodes electrically isolated from said drive electrode.

19. A diode according to claim 18, wherein said diode further comprises a pair of grooves formed on two sides of said drive electrode to extend in a longitudinal direction, and said drive electrode is formed on a mesa-shaped projecting surface portion sandwiched by said grooves.

20. A diode according to claim 19, wherein said branched bonding electrodes are electrically connected to said drive electrode in said grooves.

* * * * *